(12) United States Patent
Liu (10) Patent No.: US 11,443,939 B2
(45) Date of Patent: Sep. 13, 2022

(54) SYSTEM AND METHOD FOR DISPENSING LIQUID SPIN-ON GLASS (SOG) ONTO SEMICONDUCTOR WAFERS

(71) Applicant: TAIWAN SEMICONDUCTOR MANUFACTURING COMPANY, LTD., Hsinchu (TW)

(72) Inventor: Yung-Tsun Liu, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 279 days.

(21) Appl. No.: 16/653,441

(22) Filed: Oct. 15, 2019

(65) Prior Publication Data

US 2020/0043724 A1 Feb. 6, 2020

Related U.S. Application Data

(62) Division of application No. 13/929,964, filed on Jun. 28, 2013, now Pat. No. 10,446,390.

(51) Int. Cl.
| | |
|---|---|
| *H01L 21/02* | (2006.01) |
| *B05C 11/02* | (2006.01) |
| *B05C 11/08* | (2006.01) |
| *H01L 21/67* | (2006.01) |
| *B05D 1/00* | (2006.01) |

(52) U.S. Cl.
CPC ........ *H01L 21/02282* (2013.01); *B05C 11/02* (2013.01); *B05C 11/08* (2013.01); *B05D 1/005* (2013.01); *H01L 21/02126* (2013.01); *H01L 21/02137* (2013.01); *H01L 21/6715* (2013.01)

(58) Field of Classification Search
USPC .......................... 118/52, 612, 319, 320, 684
See application file for complete search history.

(56) References Cited

U.S. PATENT DOCUMENTS

| | | | |
|---|---|---|---|
| 5,905,656 A | 5/1999 | Wang et al. | |
| 6,054,181 A * | 4/2000 | Nanbu | H01L 21/67265 |
| | | | 427/240 |
| 6,165,270 A | 12/2000 | Konishi et al. | |
| (Continued) | | | |

FOREIGN PATENT DOCUMENTS

KR        2006028870 A  *  4/2006

OTHER PUBLICATIONS

English Translations of KR 200628870 A. (Year: 2006).*
English Translation Abstract and Drawing. (Year: 2006).*

*Primary Examiner* — Yewebdar T Tadesse
(74) *Attorney, Agent, or Firm* — Hauptman Ham, LLP (57) ABSTRACT

A spin-on glass (SOG) depositing system includes a suck back (SB) valve arranged to receive SOG. The SOG depositing system further includes a SOG dispenser having a nozzle, the SOG dispenser coupled with the SB valve for receiving SOG. The SOG depositing system further includes a detector positioned to detect SOG outside the nozzle. The SOG depositing system further includes an SB valve controller coupled with the detector for receiving one or more signals from the detector and coupled with the SB valve for controlling operation of the SB valve, wherein the SB valve controller is configured to pause sensing by the detector based on the sensed amount of SOG outside the nozzle being outside at least one operating parameter.

16 Claims, 4 Drawing Sheets

(56) References Cited

U.S. PATENT DOCUMENTS

| | | | |
|---|---|---|---|
| 6,391,111 B1* | 5/2002 | Fujimoto | B05C 11/1026 |
| | | | 118/320 |
| 7,752,999 B2 | 7/2010 | Nakashima et al. | |
| 7,878,375 B2* | 2/2011 | Yajima | B05C 11/1039 |
| | | | 222/318 |
| 2002/0037366 A1 | 3/2002 | Arioka | |
| 2003/0047136 A1 | 3/2003 | Yang | |
| 2003/0059534 A1 | 3/2003 | Nishimima et al. | |
| 2003/0180444 A1 | 9/2003 | Takeuma et al. | |
| 2007/0251450 A1 | 11/2007 | Lin | |
| 2008/0035666 A1 | 2/2008 | Porras et al. | |
| 2016/0358829 A1* | 12/2016 | Hayashi | H01L 22/10 |

* cited by examiner

SYSTEM AND METHOD FOR DISPENSING LIQUID SPIN-ON GLASS (SOG) ONTO SEMICONDUCTOR WAFERS

PRIORITY CLAIM

This application is a divisional of U.S. application Ser. No. 13/929,964, filed Jun. 28, 2013, which is incorporated herein by reference in its entirety.

BACKGROUND

Spin on glass (SOG) has a number of practical applications and benefits in semiconductor device fabrication. For example, SOG is used as an inter-layer dielectric (ILD) capable of filling sub-micron gaps between metal interconnects on a semiconductor device and being planarized. SOG can also function as a passivation layer or a photoresist layer for lithographic circuitry definition. In semiconductor device fabrication, SOG is deposited in liquid drop form onto an upper surface of a semiconductor wafer, then the entire wafer is rotated to produce a relatively uniform coating. The SOG fills gaps in the semiconductor wafer, and once hardened (cured) with an appropriate application of heat, SOG enables planarization of the surface. Planarization may be by etch-back, chemical mechanical polishing (CMP), or other suitable methods. Cured SOG has similar insulating electrical properties to silicon dioxide, which is often replaced by SOG, although SOG provides a benefit of an even lower dielectric constant. Deposition of SOG replaces a process step that may have used physical vapor deposition (sputtering), chemical vapor deposition (CVD), plasma-enhanced chemical vapor deposition (PECVD) or the like, to deposit silicon dioxide or other similar materials. However, uniformity of deposition of SOG has proven to be difficult, particularly when the SOG used is not a perfectly pure and uniform material.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated; however, that the present disclosure provides many applicable inventive concepts that can be embodied in a wide variety of specific contexts. The specific embodiments discussed are examples of specific ways to make and use, and do not limit the scope of the disclosure.

In addition, the present disclosure may repeat reference numerals and/or letters in the various examples or designate corresponding components with same last two digits, but with a different preceding digit or digits. This repetition is for the purpose of simplicity and clarity of identification of corresponding objects and does not necessarily in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature in relation to another feature. The spatially relative terms are intended to cover different orientations of the device including the features.

Figure 1A:
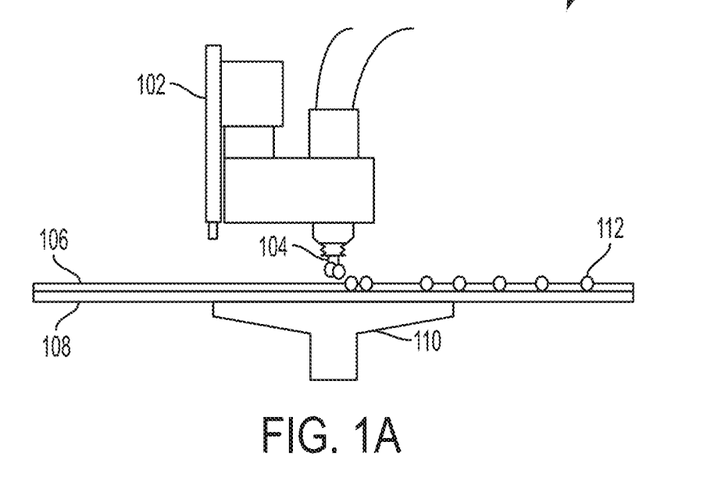
FIG. 1A is a side view of a liquid spin-on glass (SOG) dispenser dispensing liquid SOG with SOG particles onto a semiconductor wafer.
Figure 3:
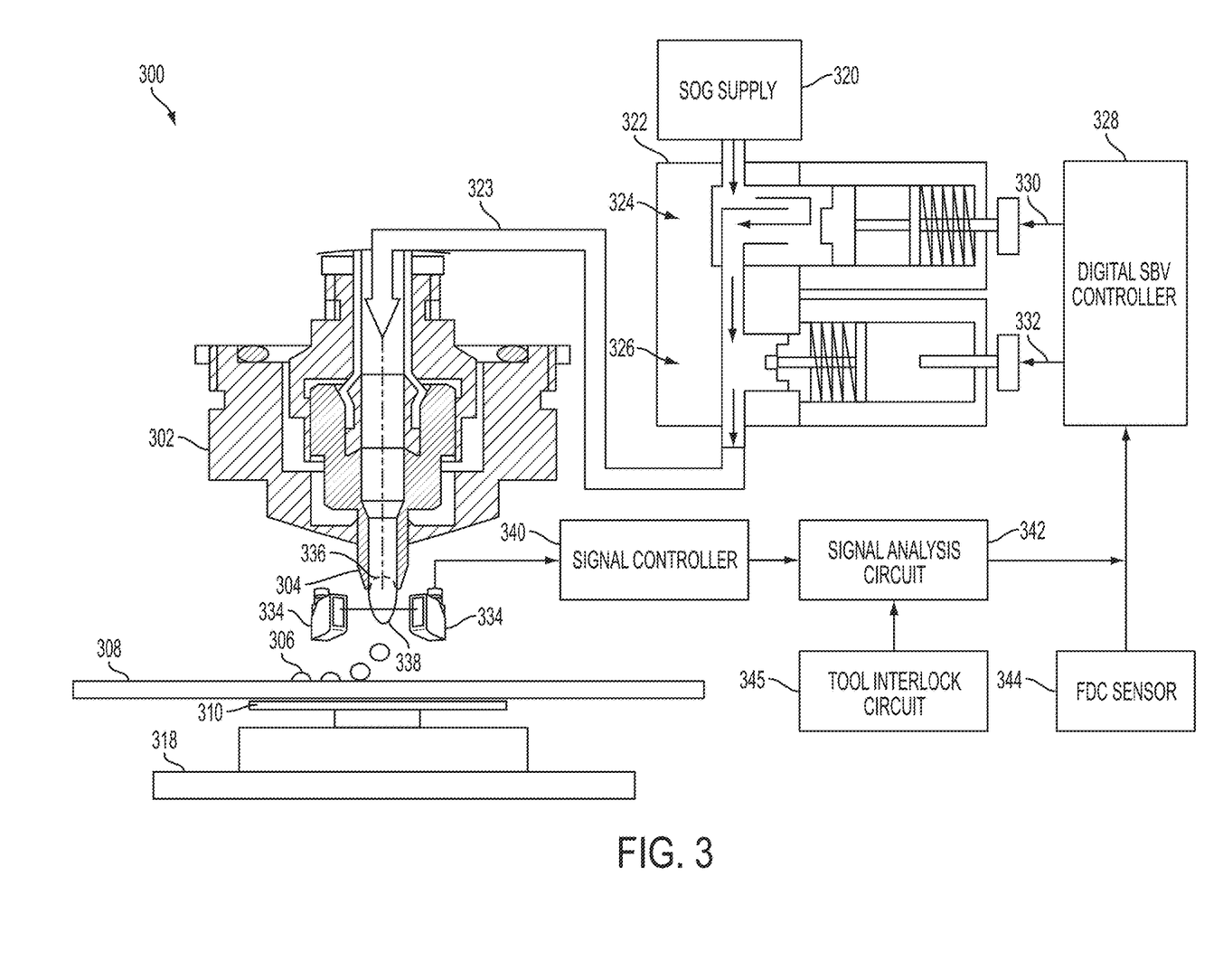
FIG. 3 is a schematic block diagram of a SOG dispensing system according to some embodiments.

FIG. 1A is a side view of a liquid spin-on glass (SOG) dispenser system 100. One of ordinary skill in the art would understand that references to SOG throughout this description refer to liquid SOG. The SOG dispenser system 100 includes a SOG dispenser 102 with a dispenser nozzle 104 for dispensing liquid SOG 106 onto a semiconductor wafer 108. The liquid SOG 106 includes a type of liquid SOG such as methylsiloxane, methylsilsesquioxane, phenylsiloxane, phenylsilsesquioxane, methylphenylsiloxane, methylphenylsilsesquioxane, silicate polymers, etc. The wafer 108 is supported by a rotatable platter 110 rotated by a physically coupled electric motor (as shown in FIG. 3). In this example, the liquid SOG 106 includes particles 112. The particles 112 are undesirable impurities or SOG crystals in the liquid SOG that are initially dispensed in a random pattern but form a spiral pattern after spinning.

Figure 1B:
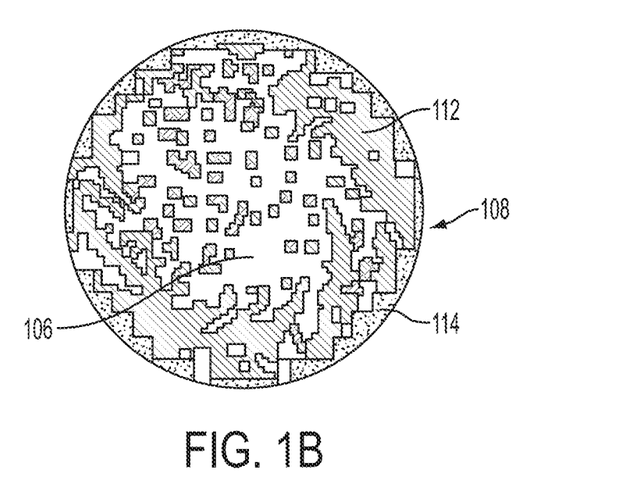
FIG. 1B is a top view of the semiconductor wafer of FIG. 1A with a liquid SOG layer having SOG particles after spinning.

FIG. 1B is a top view of the semiconductor wafer 108 from FIG. 1A with a deposited liquid SOG layer 106 after spinning. A spiral pattern of particles 112 is illustrated. A center portion of the wafer 108 contains fewer particles 112 due to their higher density, while away from the center portion some areas have high numbers of particles 112 in the spiral pattern due to clumping. SOG 106 and particles 112 are present but not shown in the unused fringe areas 114 of the wafer 108.

Figure 2A:
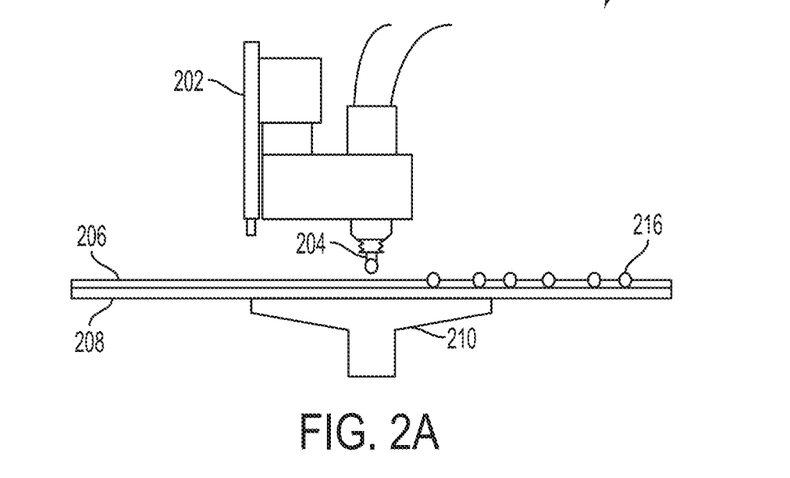
FIG. 2A is a side view of a liquid spin-on glass (SOG) dispenser dispensing liquid SOG with SOG clumps onto a semiconductor wafer.

FIG. 2A is a side view of the liquid spin-on glass (SOG) dispenser system 200. The SOG dispenser system 200 includes a SOG dispenser 202 with a dispenser nozzle 204 for dispensing liquid SOG 206 onto a semiconductor wafer 208. The liquid SOG 204 includes a type of liquid SOG such as methylsiloxane, methylsilsesquioxane, phenylsiloxane, phenylsilsesquioxane, methylphenylsiloxane, methylphenylsilsesquioxane, silicate polymers, etc. The wafer 208 is supported by a rotatable platter 210 rotated by a physically coupled electric motor. In this example, the liquid SOG 106 includes SOG clumps 216. The clumps 216 are undesirable additional amounts of SOG that are dispensed in a random pattern.

Figure 2B:
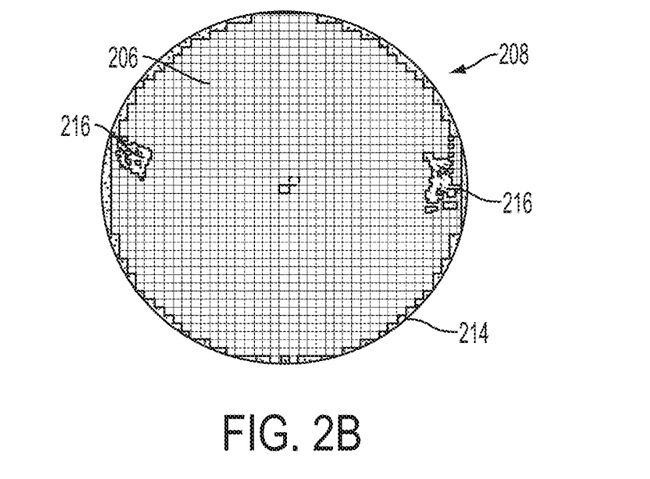
FIG. 2B is a top view of the semiconductor wafer of FIG. 2A with a liquid SOG layer having SOG particles after spinning.

FIG. 2B is a top view of the semiconductor wafer 208 from FIG. 2A with a deposited liquid SOG layer 206 after spinning. A bi-polar-resembling pattern of SOG clumps 216 is illustrated in FIG. 2B. A center portion of the wafer 208 contains fewer clumps 216, while away from the center portion two areas in particular have high numbers of clumps 216 in the bi-polar-resembling pattern. SOG 206 and clumps 216 are not shown in the unused fringe areas 214 of the wafer 208.

FIG. 3 is a schematic block diagram of a SOG dispensing system 300 according to some embodiments. The SOG dispensing system 300 includes a SOG dispenser 302 with a dispenser nozzle 304 for dispensing liquid SOG 306 onto a semiconductor wafer 308. Note that SOG 306 includes particles 112 from SOG 106 and/or clumps 216 from SOG 206, as described herein. The wafer 308 is supported by a rotatable platter 310 rotated by a physically coupled electric motor 318. In some embodiments, the SOG dispenser 302 is movable above a semiconductor wafer 308 for dispensing liquid SOG 306 through the SOG dispenser nozzle 304.

The SOG dispenser 302 receives liquid SOG 306 from a SOG supply reservoir 320. The SOG supply reservoir 320 contains enough liquid SOG 306 for SOG deposition onto multiple wafers 308, in some embodiments. SOG 306 from the SOG supply reservoir 320 is received by a suck back valve ("SB valve") 322 and carried from the SB valve 322 through a connecting pipe 323 to the SOG dispenser 302. The SB valve 322 has a switch valve 324 and an adjustment valve 326. The switch valve 324 corresponds to roughly the upper half of the SB valve 322 and the adjustment valve 326 corresponds to roughly the lower half of the SB valve 322. In some embodiments, the switch valve 324 is not spring loaded. In some embodiments, the adjustment valve 324 is not spring loaded.

The switch valve 324 of the SB valve 322 is coupled to the SOG supply reservoir 320 and switches the SOG flowing through the SB valve 322 on, if the switch valve 324 is in an open position, or off, if the switch valve 324 is in an closed position. The flow of SOG 306 is digitally controlled by a digital suck back valve controller (digital SBV controller) 328 that enables a degree of control over the flow of SOG 306 in gradations between fully on and fully off. The digital SBV controller 328 controls the switch valve 324 of the SB valve 322 through a switch valve control signal 330 that is transmitted to an electromagnetic actuator in the switch valve 324. Similarly, the digital SBV controller 328 controls the adjustment valve 326 of the SB valve 322 through an adjustment valve control signal 332 that is transmitted to an electromagnetic actuator in the adjustment valve 326. Increasing an amount of pressure applied by the actuator in the switch valve 324 in response to the switch valve control signal 330 progressively closes the switch valve 324, while decreasing the amount of pressure applied by the actuator in the switch valve 324 progressively opens the switch valve 324. SOG passing through the switch valve 324 of the SB valve 322 moves past the adjustment valve 326 of the SB valve 322.

In some embodiments, the adjustment valve 326 of the SB valve 322 is controlled by the digital SBV controller 328 to dispense SOG 306 or withdraw SOG 306 ("suck back") from the SOG dispenser 302. For example, increasing an amount of pressure applied by the actuator in the adjustment valve 326 of the SB valve 322 progressively closes the adjustment valve 326, using positive pressure to force SOG 306 out of the adjustment valve 326, while decreasing the amount of pressure progressively opens the adjustment valve 326, using negative pressure to cohesively pull SOG 306 into the adjustment valve 326. If the switch valve 324 is in a closed position and the adjustment valve 326 is being progressively opened by decreasing pressure applied to the adjustment valve 326 will withdraw or suck back SOG 306 from the SOG dispenser 302 through the connecting pipe 323 by cohesive forces in the SOG 306, thereby preventing or improving the ability to prevent an excessive amount of SOG 306 from being deposited onto a wafer 308, as can occur with unintentional dripping. Withdrawing SOG 306 that would have been deposited onto the wafer 308 reduces the amount of particles 112 and/or clumps 216 deposited onto the wafer, mitigating problems associated with particles and/or clumps in SOG.

The SOG dispenser 302 is equipped with an emitter/detector pair 334, such as a laser/photodiode pair, to detect the position of the SOG 306. The SOG 306 hanging from the SOG dispenser 302 takes either a normal SOG length 336 or an abnormal SOG length 338 in different circumstances. In the normal SOG length 336, the SOG 306 is held within or nearly within the nozzle 304 of the SOG dispenser 302 through capillary forces or the action of the SB valve 322, or both. In the abnormal SOG length 338, SOG 306 is in an undesirable SOG position relative to the nozzle 304, indicative of potential or actual unintentional dripping of SOG 306 on the wafer 308. The normal SOG length 336 is interpreted herein as SOG 306 not being in an undesirable SOG position, for example, in some embodiments, the normal SOG length 336 is less than the maximum predetermined SOG length 338 and cannot equal or exceed 2 millimeters SOG hanging from the nozzle 304 if the nozzle is not actively dispensing SOG 306 on the wafer 308. Note that the maximum predetermined SOG length 338 is determined based on a variety of factors including SOG 306 type, viscosity, temperature, pressure, nozzle 304 type, etc.

In some embodiments, unintentional dripping of SOG 306 causes an excessive SOG dispensing condition associated with the presence of particles 112 and/or clumps 216 in the SOG. SOG 306 in the abnormal length 338 will block light in the emitter/detector pair 334 thereby providing an electronic signal (or lack thereof) indicating the presence of SOG 306 in the abnormal length 338, otherwise the electronic signal from the emitter/detector pair 334 will correspondingly indicate that the SOG 306 is in the normal length 336. Note that signals indicating SOG 306 in the abnormal length 338 during intentional SOG dispensing are ignored. A signal controller 340 receives a signal from the emitter/detector pair 334 indicating the normal length 336 or the abnormal length 338 of the SOG 306 with respect to the nozzle 304. In some embodiments the signal controller 340 moves the emitter/detector pair 334 in an up and down fashion to precisely determine the length of any SOG 306 hanging from the nozzle A signal analysis circuit 342 receives one or more signals from the signal controller 340 derived from the emitter/detector pair 334 and provides digital input to the digital SBV controller 328. In some embodiments the emitter/detector pair 334 produces an analog signal or signals instead of a digital signal or signals. A fluid data calibration (FDC) sensor 344 provides a digital indication to the digital SBV controller 328 regarding the dispensing duration timing and volume of SOG 306 being dispensed onto the wafer 308 by the SOG dispensing system 300. In some embodiments the fluid data calibration (FDC) sensor 344 produces an analog signal or signals instead of a digital signal or signals. A tool interlock circuit 345 provides set operating parameters for the SOG dispenser 302 to the signal analysis circuit 342 to determine if the SOG dispenser 302 is not operating within set operating parameters. For example, if the SOG dispenser 302 is not operating within set operating parameters, the tool interlock circuit 345 causes the digital SBV controller 328 to close the switch valve 324 of the SB valve 322 and transmit an alarm signal.

In some other embodiments, the emitter/detector pair 334 is physically moved up and down and/or optically moved up and down, relative to the nozzle 304, with moving lenses, moving mirrors and/or moving standing acoustic waves, thereby scanning the SOG 306, to provide a more precise indication of the length and the corresponding volume of SOG 306 outside the nozzle 304. Note that the abnormal length 338 of the SOG 306 in these embodiments is a range of positions outside the nozzle 304. For example, the presence of SOG 306 hanging 2 millimeters or more below the nozzle 304 is considered to be in the abnormal length 338.

Figure 4:
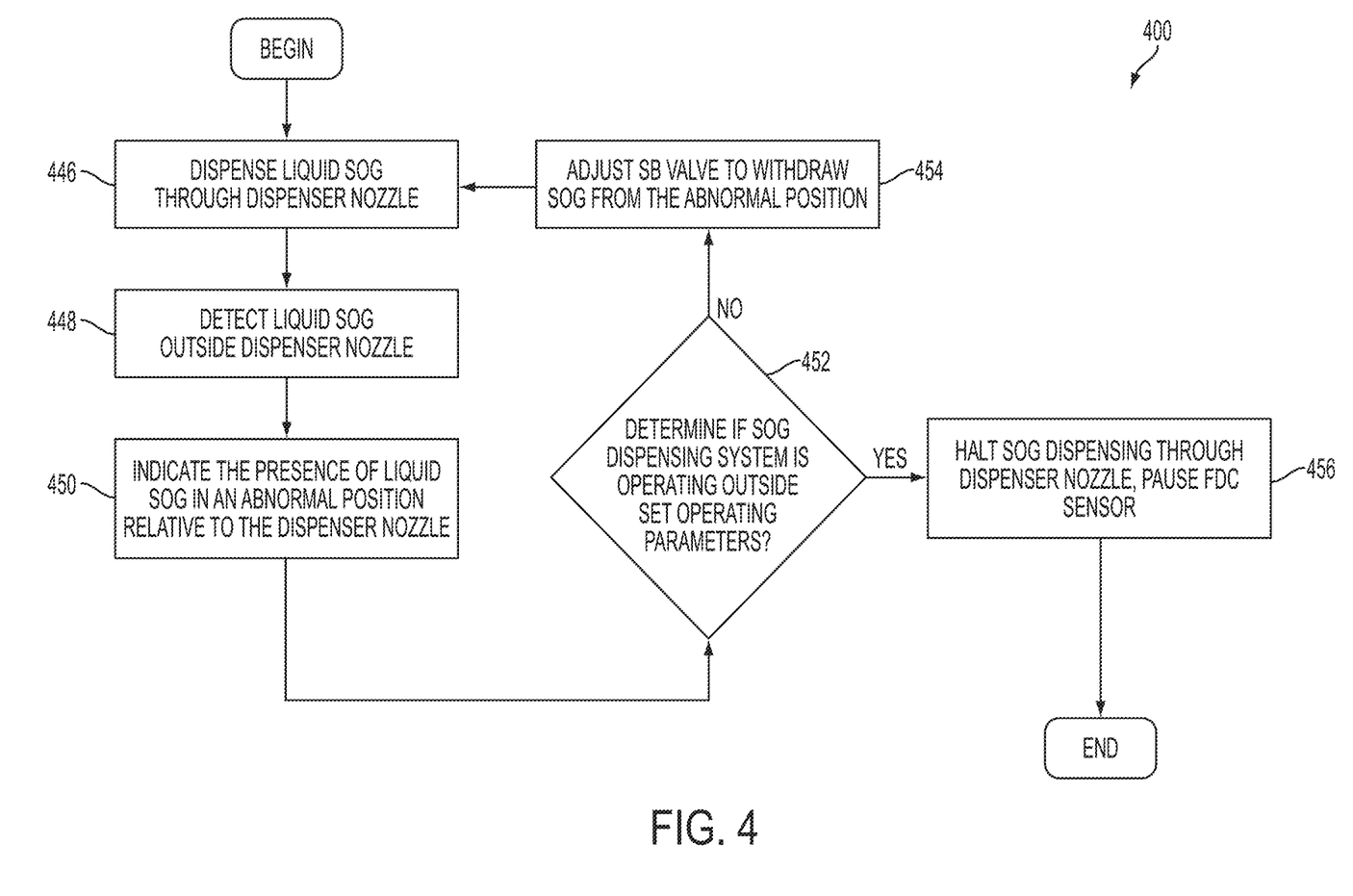
FIG. 4 is a flowchart of SOG dispensing according to some embodiments.

FIG. 4 is a flowchart of a SOG dispensing method according to some embodiments. At operation 446, liquid SOG 306 is dispensed through the dispenser nozzle 304 to begin the process of depositing a targeted amount of SOG onto the wafer 308. In some embodiments, a drop of liquid SOG 306 is dispensed approximately every 4.5 seconds until 12-13 drops of SOG have been dispensed in approximately 55-60 seconds. In some embodiments, longer or shorter dispensing times and a greater or fewer number of SOG 306 drops are used depending on wafer size and specified thickness of SOG.

At operation 448, liquid SOG 306 is detected outside of the dispenser nozzle 304 at a time when the SOG should not be there, i.e., when intentional dispensing is not occurring. In some embodiments, detection is via the emitter/detector pair 334 or other sensing apparatus. The undesirable presence of a drop of liquid SOG 306 is detected by SOG extending beyond the nozzle 304 opening and blocking light from the laser from reaching the photodiode in the emitter/detector pair 334. In other embodiments, the emitter/detector pair 334 is not stationary, but rather moves up and down to scan the presence of liquid SOG 306 outside the dispenser nozzle 304. In still other embodiments, other sensor apparatus detect liquid SOG 306 outside the dispenser nozzle 304, such as detectors or emitter/detector pairs based on detection of changes in sound, ultraviolet light, infrared light, radar, other portions of the electromagnetic spectrum, magnetic fields, electrical fields, etc.

At operation 450, the liquid SOG dispensing system 300 indicates the presence of liquid SOG 306 in an abnormal length 338 relative to the dispenser nozzle 304. In some embodiments, the system 300 indicates the abnormal presence of SOG 306 if the SOG is present at or beyond a certain point relative to the nozzle, such as if the emitter/detector pair 334 is stationary. In other embodiments, the system 300 indicates the abnormal presence of SOG 306 including how great a length, e.g., 2 millimeters below the nozzle 304, and/or volume of SOG 306 is present outside of the nozzle 304, such as in those embodiments wherein the emitter/detector pair 334 is not stationary and moves in a up and down fashion to scan for the presence of SOG 306 outside of the nozzle 304.

In operation 452, the signal analysis circuit receives the indication of the presence of liquid SOG 306 in an abnormal length 338 relative to the dispenser nozzle 304 and determines whether the SOG dispensing system 300 is or is not operating outside set operating parameters. If the SOG dispensing system 300 is not operating outside set operating parameters, then in step 454 the digital SBV controller 328 adjusts the SB valve 322 to withdraw the liquid SOG 306 present in the abnormal length 338 back to a normal length 336. If the SOG dispensing system 300 is operating outside set operating parameters, SOG dispensing is halted. In some embodiments, an alarm signal is transmitted and/or one or more signals from the FDC sensor 344 are stored in the digital SBV controller 328, thereby enabling subsequent failure analysis and preventing or improving the ability to prevent further inappropriate SOG 306 dispensing and the corresponding potential loss of valuable semiconductor wafers 308. In operation 456, if the SOG dispensing system is determined as operating outside of set operating parameters, SOG dispensing through the dispensing nozzle is halted and the FDC sensor is paused.

According to some embodiments, a method of depositing spin-on glass (SOG) onto a semiconductor wafer includes dispensing liquid SOG through a dispenser nozzle. The liquid SOG is detected outside of the dispenser nozzle. The presence of liquid SOG in an abnormal length relative to the dispenser nozzle is indicated. Then an SB valve is adjusted to withdraw liquid SOG from the abnormal length.

According to some embodiments, a method of depositing spin-on glass (SOG) onto a semiconductor wafer includes dispensing liquid SOG through a dispenser nozzle. The liquid SOG is detected outside of the dispenser nozzle with an emitter/detector pair that movably scans for the presence of SOG. The presence of liquid SOG in an abnormal length relative to the dispenser nozzle is indicated. Then an SB valve is adjusted to withdraw liquid SOG from the abnormal length.

According to some embodiments, a liquid spin-on glass (SOG) depositing system includes a suck back (SB) valve physically coupled to the SOG supply reservoir for receiving SOG, a SOG dispenser having a nozzle, the SOG dispenser physically coupled to the SB valve for receiving SOG, a sensor positioned to detect SOG outside the nozzle and a digital SB valve controller, the digital SB valve controller coupled to the sensor for receiving signals from the sensor and to the SB valve for controlling operation of the SB valve.

According to some embodiments, a method of manufacturing a semiconductor device includes dispensing liquid SOG through a dispenser nozzle. The liquid SOG is detected outside of the dispenser nozzle. The presence of liquid SOG in an abnormal length relative to the dispenser nozzle is indicated. Then an SB valve is adjusted to withdraw liquid SOG from the abnormal length.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

An aspect of this description relates to a spin-on glass (SOG) depositing system. The SOG depositing system includes a suck back (SB) valve arranged to receive SOG. The SOG depositing system further includes a SOG dispenser having a nozzle, the SOG dispenser coupled with the SB valve for receiving SOG. The SOG depositing system further includes a detector positioned to detect SOG outside the nozzle. The SOG depositing system further includes an SB valve controller coupled with the detector for receiving one or more signals from the detector and coupled with the SB valve for controlling operation of the SB valve, wherein the SB valve controller is configured to pause sensing by the detector based on the sensed amount of SOG outside the nozzle being outside at least one operating parameter. In some embodiments, the SB valve includes a switch valve and an adjustment valve. In some embodiments, the switch valve is adapted to be moved by a first electromagnetic actuator. In some embodiments, the adjustment valve is adapted to be moved by a second electromagnetic actuator. In some embodiments, the switch valve is spring loaded. In some embodiments, the adjustment valve is spring loaded. In some embodiments, the detector comprises an optical detector. In some embodiments, the SOG depositing system further includes a tool interlock circuit, wherein the tool interlock circuit is configured to instruct the SB valve controller to close the SB valve in response to the SOG dispenser operating outside of predetermined operation parameters. In some embodiments, the detector is movable relative to the nozzle. In some embodiments, the detector is configured to scan SOG outside of the nozzle.

An aspect of this description relates to a spin-on glass (SOG) depositing system. The SOG depositing system includes a suck back (SB) valve for receiving SOG. The SOG depositing system a nozzle connected to the SB valve, wherein the nozzle is configured to receive SOG from the SB valve. The SOG depositing system includes an optical detector for detecting SOG outside the nozzle. The SOG depositing system includes an SB valve controller configured to receive a signal from the optical detector, wherein the SB valve controller is configured to control operation of the SB valve, and to pause sensing by the optical detector in response to a detected amount of SOG outside the nozzle being outside at least one operating parameter. In some embodiments, the optical detector is configured to scan the SOG outside the nozzle. In some embodiments, the optical detector is configured to scan the SOG outside the nozzle by moving the optical detector relative to the nozzle. In some embodiments, the optical detector is configured to scan the SOG outside the nozzle by moving a lens or a mirror within the optical detector. In some embodiments, the SB valve includes a switch valve; and an adjustment valve, wherein the adjustment valve is between the switch valve and the nozzle. In some embodiments, the SB valve controller is configured to withdraw SOG outside of the nozzle, in response to the detected amount of SOG outside the nozzle being outside of the at least one operating parameter, by closing the switch valve and opening the adjustment valve.

An aspect of this description relates to a spin-on glass (SOG) depositing system. The SOG depositing system includes a suck back (SB) valve for receiving SOG. The SOG depositing system includes a nozzle connected to the SB valve, wherein the nozzle is configured to receive SOG from the SB valve. The SOG depositing system includes a detector for detecting SOG outside the nozzle. The SOG depositing system includes an SB valve controller configured to receive a signal from the detector, wherein the SB valve controller is configured to control operation of the SB valve, and to pause sensing by the detector in response to a detected amount of SOG outside the nozzle being outside at least one operating parameter. The SOG depositing system includes a tool interlock circuit, wherein the tool interlock circuit is configured to instruct the SB valve controller to close the SB valve in response to the SOG dispenser operating outside of predetermined operation parameters. In some embodiments, the detector is configured to detect a length of the SOG extending from the nozzle. In some embodiments, the detector is movable relative to the nozzle. In some embodiments, the detector is an optical detector.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A liquid spin-on glass (SOG) depositing system, comprising:
    a suck back (SB) valve arranged to receive liquid SOG;
    a liquid SOG dispenser having a nozzle, the liquid SOG dispenser coupled with the SB valve for receiving liquid SOG;
    a detector positioned to detect liquid SOG outside the nozzle; and
    an SB valve controller coupled with the detector for receiving one or more signals from the detector and coupled with the SB valve for controlling operation of the SB valve, wherein the SB valve controller is configured to pause sensing by the detector based on the sensed amount of SOG outside the nozzle indicates the liquid SOG depositing system is operating outside at least one operating parameter, wherein the SB valve comprises:
    a switch valve; and
    an adjustment valve, wherein the adjustment valve is between the switch valve and the nozzle, wherein the SB valve controller is configured to withdraw liquid SOG outside of the nozzle, in response to the detected amount of liquid SOG outside the nozzle being outside of the at least one operating parameter, by closing the switch valve and opening the adjustment valve.

2. The liquid SOG depositing system of claim 1, wherein the switch valve is movable by a first electromagnetic actuator.

3. The liquid SOG depositing system of claim 2, wherein the adjustment valve is movable by a second electromagnetic actuator.

4. The liquid SOG depositing system of claim 1, wherein the switch valve is spring loaded.

5. The liquid SOG depositing system of claim 1, wherein the adjustment valve is spring loaded.

6. The liquid SOG depositing system of claim 1, wherein the detector comprises an optical detector.

7. The liquid SOG depositing system of claim 1, further comprising a tool interlock circuit, wherein the tool interlock circuit is configured to instruct the SB valve controller to close the SB valve in response to the liquid SOG dispenser operating outside of predetermined operation parameters.

8. The liquid SOG depositing system of claim 1, wherein the detector is movable relative to the nozzle.

9. The liquid SOG depositing system of claim 1, wherein the detector is configured to scan liquid SOG outside of the nozzle.

10. A liquid spin-on glass (SOG) depositing system, comprising:
    a suck back (SB) valve for receiving liquid SOG;
    a nozzle connected to the SB valve, wherein the nozzle is configured to receive liquid SOG from the SB valve;
    an optical detector for detecting liquid SOG outside the nozzle; and an SB valve controller configured to receive a signal from the optical detector, wherein the SB valve controller is configured to control operation of the SB valve, and to pause sensing by the optical detector in response to a detected amount of liquid SOG outside the nozzle indicates the liquid SOG depositing system is operating outside at least one operating parameter, wherein the SB valve comprises:
a switch valve; and
an adjustment valve, wherein the adjustment valve is between the switch valve and the nozzle, wherein the SB valve controller is configured to withdraw liquid SOG outside of the nozzle, in response to the detected amount of liquid SOG outside the nozzle being outside of the at least one operating parameter, by closing the switch valve and opening the adjustment valve.

11. The liquid SOG depositing system of claim 10, wherein the optical detector is configured to scan the liquid SOG outside the nozzle.

12. The liquid SOG depositing system of claim 11, wherein the optical detector is configured to scan the liquid SOG outside the nozzle by moving the optical detector relative to the nozzle.

13. The liquid SOG depositing system of claim 11, wherein the optical detector is configured to scan the liquid SOG outside the nozzle by moving a lens or a mirror within the optical detector.

14. A liquid spin-on glass (SOG) depositing system, comprising:
a suck back (SB) valve for receiving liquid SOG;
a nozzle connected to the SB valve, wherein the nozzle is configured to receive liquid SOG from the SB valve;
a detector for detecting liquid SOG outside the nozzle, wherein the detector is configured to detect a length of the liquid SOG extending from the nozzle;
an SB valve controller configured to receive a signal from the detector, wherein the SB valve controller is configured to control operation of the SB valve, and to pause sensing by the detector in response to a detected amount of liquid SOG outside the nozzle being indicates the liquid SOG depositing system is operating outside at least one operating parameter; and
a tool interlock circuit, wherein the tool interlock circuit is configured to instruct the SB valve controller to close the SB valve in response to the liquid SOG depositing system operating outside of predetermined operation parameters.

15. The liquid SOG depositing system of claim 14, wherein the SB valve controller is configured to withdraw liquid SOG outside of the nozzle, in response to the detected amount of liquid SOG outside the nozzle being outside of the at least one operating parameter, by closing the switch valve and opening the adjustment valve.

16. The liquid SOG depositing system of claim 14, wherein the detector is an optical detector.

* * * * *